(12) United States Patent
Cao et al.

(10) Patent No.: US 8,411,383 B2
(45) Date of Patent: Apr. 2, 2013

(54) SYSTEMS AND METHODS FOR HIGH ORDER ASYMMETRY CORRECTION

(75) Inventors: Zhengxin Cao, Shanghai (CN); Hao Qiong Chen, Shanghai (CN); Shu Dong Cheng, Shanghai (CN); De Qun Ma, Shanghai (CN); Donghui Wang, Shanghai (CN); Yan Xu, Shanghai (CN)

(73) Assignee: LSI Corporation, San Jose, CA (US)

( * ) Notice: Subject to any disclaimer, the term of this patent is extended or adjusted under 35 U.S.C. 154(b) by 674 days.

(21) Appl. No.: 12/651,310

(22) Filed: Dec. 31, 2009

(65) Prior Publication Data

US 2011/0019301 A1 Jan. 27, 2011

(30) Foreign Application Priority Data

Jul. 22, 2009 (CN) .......................... 2009 1 0152182

(51) Int. Cl.
*G11B 5/02* (2006.01)
*G11B 5/09* (2006.01)

(52) U.S. Cl. .............................. 360/25; 360/46; 360/67

(58) Field of Classification Search .................... None
See application file for complete search history.

(56) References Cited

U.S. PATENT DOCUMENTS

| | | | |
|---|---|---|---|
| 3,973,182 A | 8/1976 | Kataoka | |
| 3,973,183 A | 8/1976 | Kataoka | |
| 4,024,571 A | 5/1977 | Dischert et al. | |
| 4,777,544 A | 10/1988 | Brown et al. | |
| 5,130,866 A | 7/1992 | Klaassen et al. | |
| 5,237,325 A | 8/1993 | Klein et al. | |
| 5,278,703 A | 1/1994 | Rub et al. | |
| 5,309,357 A | 5/1994 | Stark et al. | |
| 5,341,249 A | 8/1994 | Abbott et al. | |
| 5,377,058 A | 12/1994 | Good et al. | |
| 5,521,948 A | 5/1996 | Takeuchi | |
| 5,523,902 A | 6/1996 | Pederson | |
| 5,668,679 A | 9/1997 | Swearingen et al. | |
| 5,696,639 A | 12/1997 | Spurbeck et al. | |
| 5,781,129 A | 7/1998 | Schwartz et al. | |
| 5,798,885 A | 8/1998 | Saiki et al. | |
| 5,835,295 A | 11/1998 | Behrens | |
| 5,844,920 A | 12/1998 | Zook et al. | |
| 5,852,524 A | 12/1998 | Glover et al. | |
| 5,986,830 A | 11/1999 | Hein | |
| 5,987,562 A | 11/1999 | Glover | |
| 6,009,549 A | 12/1999 | Bliss et al. | |
| 6,023,383 A | 2/2000 | Glover et al. | |
| 6,069,583 A | 5/2000 | Silverstrin et al. | |
| 6,081,397 A | 6/2000 | Belser | |
| 6,111,712 A | 8/2000 | Vishakhadatta et al. | |

(Continued)

OTHER PUBLICATIONS

Annampedu, V. and Aziz, P.M., "Adaptive Algorithms for Asynchronous Detection of Coded Servo Signals Based on Interpolation", IEEE Trans. on Mag., vol. 41, No. 10, Oct. 2005.

(Continued)

*Primary Examiner* — Regina N Holder (74) *Attorney, Agent, or Firm* — Hamilton DeSanctis and Cha (57) ABSTRACT

Various embodiments of the present invention provide systems and methods for signal offset cancellation. For example, a method for error cancellation is disclosed. The method includes: receiving an input signal that includes a second order error component; applying a transfer function to the processed input to reduce the second order error component; and providing an output signal that is the result of applying the transfer function to the input signal.

20 Claims, 4 Drawing Sheets

U.S. PATENT DOCUMENTS

| | | | |
|---|---|---|---|
| 6,208,478 B1 | 3/2001 | Chiu et al. | |
| 6,278,591 B1 | 8/2001 | Chang | |
| 6,400,518 B1 | 6/2002 | Bhaumik et al. | |
| 6,404,829 B1 | 6/2002 | Sonu | |
| 6,414,806 B1 * | 7/2002 | Gowda et al. | 360/25 |
| 6,441,661 B1 | 8/2002 | Aoki et al. | |
| 6,490,110 B2 | 12/2002 | Reed et al. | |
| 6,493,162 B1 | 12/2002 | Fredrickson | |
| 6,519,102 B1 | 2/2003 | Smith | |
| 6,529,340 B2 * | 3/2003 | Gowda et al. | 360/25 |
| 6,530,060 B1 | 3/2003 | Vis et al. | |
| 6,603,622 B1 | 8/2003 | Christiansen et al. | |
| 6,606,048 B1 | 8/2003 | Sutardja | |
| 6,633,447 B2 | 10/2003 | Franck et al. | |
| 6,646,822 B1 | 11/2003 | Tuttle et al. | |
| 6,657,802 B1 | 12/2003 | Ashley et al. | |
| 6,775,529 B1 | 8/2004 | Roo | |
| 6,788,484 B2 | 9/2004 | Honma | |
| 6,813,108 B2 | 11/2004 | Annampedu et al. | |
| 6,816,328 B2 | 11/2004 | Rae | |
| 6,839,014 B2 | 1/2005 | Uda | |
| 6,856,183 B2 | 2/2005 | Annampedu | |
| 6,876,511 B2 | 4/2005 | Koyanagi | |
| 6,912,099 B2 | 6/2005 | Annampedu et al. | |
| 6,963,521 B2 | 11/2005 | Hayashi | |
| 6,999,257 B2 | 2/2006 | Takeo | |
| 6,999,264 B2 | 2/2006 | Ehrlich | |
| 7,002,767 B2 | 2/2006 | Annampedu et al. | |
| 7,038,875 B2 | 5/2006 | Lou et al. | |
| 7,072,137 B2 | 7/2006 | Chiba | |
| 7,082,005 B2 | 7/2006 | Annampedu et al. | |
| 7,092,462 B2 | 8/2006 | Annampedu et al. | |
| 7,126,776 B1 | 10/2006 | Warren, Jr. et al. | |
| 7,136,250 B1 | 11/2006 | Wu et al. | |
| 7,154,689 B1 | 12/2006 | Shepherd et al. | |
| 7,167,328 B2 | 1/2007 | Annampedu et al. | |
| 7,180,693 B2 | 2/2007 | Annampedu et al. | |
| 7,187,739 B2 | 3/2007 | Ma | |
| 7,191,382 B2 | 3/2007 | James et al. | |
| 7,193,544 B1 | 3/2007 | Fitelson et al. | |
| 7,193,798 B2 | 3/2007 | Byrd et al. | |
| 7,199,961 B1 | 4/2007 | Wu et al. | |
| 7,203,013 B1 | 4/2007 | Han et al. | |
| 7,206,146 B2 | 4/2007 | Flynn et al. | |
| 7,230,789 B1 | 6/2007 | Brunnett et al. | |
| 7,253,984 B1 | 8/2007 | Patapoutian et al. | |
| 7,301,717 B1 | 11/2007 | Lee et al. | |
| 7,308,057 B1 | 12/2007 | Patapoutian | |
| 7,362,536 B1 | 4/2008 | Liu et al. | |
| 7,375,918 B1 | 5/2008 | Shepherd et al. | |
| 7,411,531 B2 | 8/2008 | Aziz et al. | |
| 7,420,498 B2 | 9/2008 | Barrenscheen | |
| 7,423,827 B2 | 9/2008 | Neville et al. | |
| 7,446,690 B2 | 11/2008 | Kao | |
| 7,499,238 B2 | 3/2009 | Annampedu | |
| 2002/0001151 A1 | 1/2002 | Lake | |
| 2002/0150179 A1 | 10/2002 | Leis et al. | |
| 2002/0176185 A1 | 11/2002 | Fayeulle et al. | |
| 2002/0181377 A1 | 12/2002 | Nagata et al. | |
| 2003/0095350 A1 | 5/2003 | Annampedu et al. | |
| 2005/0046982 A1 | 3/2005 | Liu et al. | |
| 2005/0157415 A1 | 7/2005 | Chiang et al. | |
| 2005/0243455 A1 | 11/2005 | Annampedu | |
| 2007/0071152 A1 | 3/2007 | Chen et al. | |
| 2007/0104300 A1 | 5/2007 | Esumi et al. | |
| 2007/0183073 A1 | 8/2007 | Sutardja et al. | |
| 2007/0230015 A1 | 10/2007 | Yamashita et al. | |
| 2007/0263311 A1 | 11/2007 | Smith | |
| 2008/0080082 A1 | 4/2008 | Erden et al. | |
| 2008/0212715 A1 | 9/2008 | Chang | |
| 2008/0266693 A1 | 10/2008 | Bliss et al. | |
| 2009/0002862 A1 | 1/2009 | Park et al. | |

OTHER PUBLICATIONS

Aziz and Annampedu, "Interpolation Based Maximum-Likelihood (ML) detection of Asynchronous Servo Repeatable Run Out Data", IEEE Int. Mag. Con., vol. 42, No. 10, Oct. 2006.

* cited by examiner

SYSTEMS AND METHODS FOR HIGH ORDER ASYMMETRY CORRECTION

CROSS REFERENCE TO RELATED CASES

The present application claims priority to Chinese Patent Application No. 200910152182.3 entitled "Systems and Methods for High Order Asymmetry Correction", and filed Jul. 22, 2009 by Cao et al. The entirety of the aforementioned application is incorporated herein by reference for all purposes.

BACKGROUND OF THE INVENTION

The present inventions are related to systems and methods for canceling offset signals.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In such systems, errors are introduced to the data during the transmission and recovery processes. Such errors are often difficult to remove and in some cases can render the original signal difficult or impossible to recover.

Hence, there exists a need in the art for advanced systems and methods for error correction in data processing systems.

BRIEF SUMMARY OF THE INVENTION

The present inventions are related to systems and methods for canceling offset signals.

Various embodiments of the present invention provide offset cancellation systems that include a correction circuit. The correction circuit is operable to: receive an input signal including an error component, and apply a transfer function to the input signal to reduce the error component. The transfer function is:

$$\left[\frac{0.5}{(1-az(t))} + \frac{1.5}{(1+az(t))} - 1\right].$$

In addition, the correction circuit is operable to provide an output signal that is the result of applying the transfer function to the input signal. In some instances of the aforementioned embodiments, the correction circuit includes an amplifier receiving the input signal and providing the output signal, the input signal is a differential input signal, and the output signal is a differential output signal. In such instances, the differential input signal includes a positive input signal and a negative input signal, and the differential output signal includes a negative output signal and a positive output signal. In particular cases, the system is incorporated in a read channel circuit of a hard disk drive, the input signal is derived from a storage medium, and a derivative of the output signal is provided to data processing circuit.

In some instances of the aforementioned embodiments, the amplifier includes: a differential amplifier; a first transistor having a gate, a first leg, and a second leg; and a second transistor having a gate, a first leg, and a second leg. The differential amplifier includes a first input, a second input, a first output and a second output. The first output is electrically coupled to the positive output, and the second output is electrically coupled to the negative output. The gate of the first transistor is electrically coupled to a bias voltage, the first leg of the first transistor is electrically coupled to the negative input, and the second leg of the first transistor is electrically coupled to the first input of the differential amplifier. The gate of the second transistor is electrically coupled to the bias voltage, the first leg of the second transistor is electrically coupled to the positive input, and the second leg of the second transistor is electrically coupled to the second input of the differential amplifier. In particular instances, the bias voltage is the common mode of the positive input and the negative input.

In various instances of the aforementioned embodiments, the amplifier further includes: a third transistor having a gate, a first leg, and a second leg; a fourth transistor having a gate, a first leg, and a second leg; a fifth transistor having a gate, a first leg, and a second leg; and a sixth transistor having a gate, a first leg, and a second leg. The gate of the third transistor is electrically coupled to the negative input, and the first leg of the third transistor is electrically coupled to the positive input. The gate of the fourth transistor is electrically coupled to the positive input, and the first leg of the fourth transistor is electrically coupled to the negative input. The gate of the fifth transistor is electrically coupled to the bias voltage, the first leg of the fifth transistor is electrically coupled to the second leg of the third transistor, and the second leg of the fifth transistor is electrically coupled to the positive output. The gate of the sixth transistor is electrically coupled to the bias voltage, the first leg of the sixth transistor is electrically coupled to the second leg of the fourth transistor, and the second leg of the sixth transistor is electrically coupled to the negative output. In some cases, the first transistor, the second transistor, the fifth transistor and the sixth transistor each exhibit a first size; the third transistor exhibits a second size; the fourth transistor exhibits a third size. In such cases, the second size is approximately twice the first size, and the second size is approximately three times the third size. In other cases, the third size is approximately twice the first size, and the third size is approximately three times the second size.

In one or more instances of the aforementioned embodiments, the amplifier further includes: a first selector circuit; a second selector circuit; a third transistor having a gate, a first leg, and a second leg; a fourth transistor having a gate, a first leg, and a second leg; a fifth transistor having a gate, a first leg, and a second leg; a sixth transistor having a gate, a first leg, and a second leg; a seventh transistor having a gate, a first leg, and a second leg; and an eighth sixth transistor having a gate, a first leg, and a second leg. The first selector circuit provides the negative input when a selector control is asserted at a first assertion level and provides the positive input when the selector control is asserted at a second assertion level. The second selector circuit provides the negative input when a selector control is asserted at the second assertion level and provides the positive input when the selector control is asserted at the first assertion level. The gate of the third transistor is electrically coupled to an output of the first selector circuit, and the first leg of the third transistor is electrically coupled to the positive input. The gate of the fourth transistor is electrically coupled to an output of the second selector circuit, and the first leg of the fourth transistor is electrically coupled to the positive input. The gate of the seventh transistor is electrically coupled to the output of the second selector circuit, and the first leg of the seventh transistor is electrically coupled to the negative input. The gate of the eighth transistor is electrically coupled to the output of the first selector circuit, and the first leg of the eighth transistor is electrically coupled to the negative input. The gate of the fifth transistor is electrically coupled to the bias voltage, the first leg of the fifth transistor is electrically coupled to the second leg of the third transistor and to the second leg of the fourth transistor, and the second leg of the fifth transistor is electrically coupled to the positive output. The gate of the sixth transistor is electrically coupled to the bias voltage, the first leg of the sixth transistor is electrically coupled to the second leg of the seventh transistor and to the second leg of the eighth transistor, and the second leg of the sixth transistor is electrically coupled to the negative output. In particular cases, the first transistor, the second transistor, the fifth transistor and the sixth transistor each exhibit a first size; the third transistor and the eighth transistor exhibits a second size; the fourth transistor and the seventh transistor exhibit a third size. In such cases, the second size is approximately twice the first size; and the second size is approximately three times the third size. In one or more cases, the system is incorporated in a read channel circuit of a hard disk drive. In such cases, the input signal is derived from a storage medium, a derivative of the output signal is provided to detector circuit, and the selector control is derived based upon an output of the detector circuit.

Other embodiments of the present invention provide data processing circuits. Such data processing circuits include an analog pre-processing circuit, a correction circuit, and a data detector circuit. The analog pre-processing circuit receives a data input and provides a processed input that includes an error component. The correction circuit is operable to: receive the processed input; apply a transfer function to the processed input to reduce the error component; and provide an output signal. The signal is the result of applying the transfer function to the input signal. The detector circuit applies a detection algorithm to a derivative of the output signal.

Yet other embodiments of the present invention provide methods for error cancellation. Such methods include: receiving an input signal that includes a second order error component; applying a transfer function to the processed input to reduce the second order error component; and providing an output signal that is the result of applying the transfer function to the input signal.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for canceling offset signals.

Figure 1:
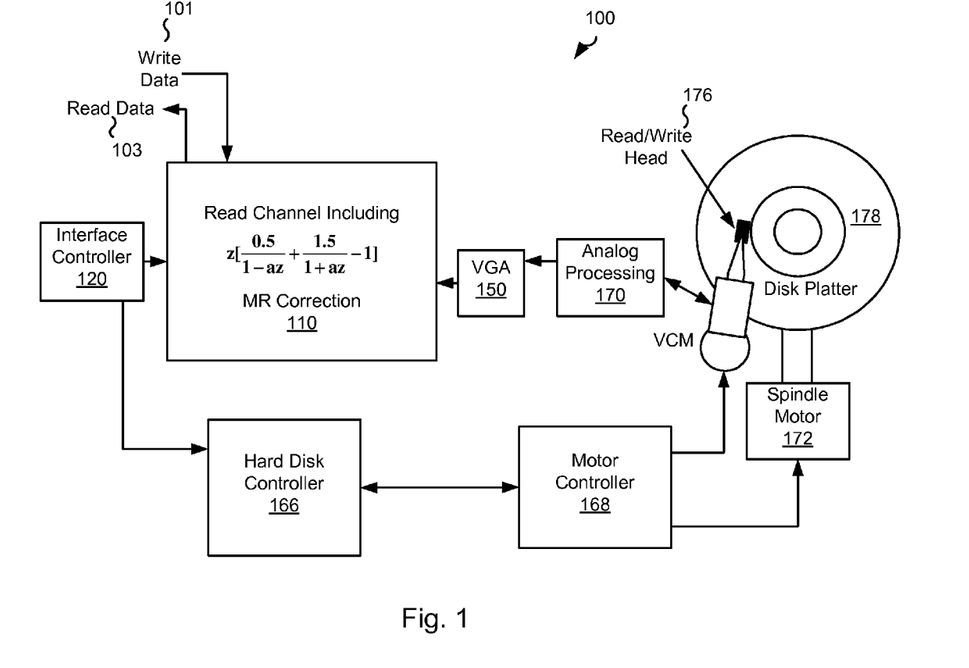
FIG. 1 shows a storage system including a read channel module that includes MR correction in accordance with one or more embodiments of the present invention.

Turning to FIG. 1, a storage system 100 including read channel circuit 110 including asymmetry (MR) correction circuitry in accordance with various embodiments of the present invention. Storage system 100 may be, for example, a hard disk drive. One implementation of the MR correction circuitry is discussed below in relation to FIG. 4. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Figure 2:
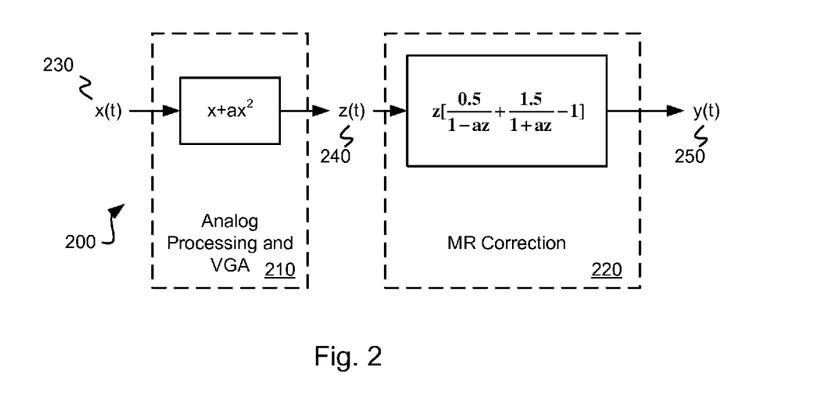
FIG. 2 is a graphical depiction showing the process of MR correction in accordance with various embodiments of the present invention.

Turning to FIG. 2, is a graphical depiction 200 shows the process of MR correction in accordance with various embodiments of the present invention. Graphical depiction 200 includes a block 210 representing analog processing and variable gain amplification. Block 210 receives an original input signal (x(t)) 230 and provides an error laden signal (z(t)) 240. In some cases, original input signal 230 is derived from a storage medium. In such a case, the difference between error laden signal 240 and original input signal is that introduced by a read/write head assembly, a variable gain amplifier, and any analog circuitry between read/write head assembly and the variable gain amplifier. This difference is represented by the term $ax^2$ in block 210. Graphical depiction 200 also includes a block 220 representing MR correction circuitry. Block 220 receives error laden signal 240, and provides an output signal (y(t)) 250.

As suggested above, error laden signal 240 is original signal 230 augmented by an error term, $ax^2$. Thus, error laden signal 240 may be represented by the following equation:

$$z(t)=x+ax^2.$$

An interim term (k(t)) in accordance with the following equation may be used for derivation:

$$k(t) = \frac{z(t)}{1+az(t)} = z(t) - az^2(t) + a^2z^3(t) + o(z^4(t)),$$

Where $o(x^4(t))$ and $o(z^4(t))$ represent a sum of the optional high-order terms starting with the fourth order. The interim term may be mathematically manipulated as follows:

$$k(t)=[x(t)+ax^2(t)]-a[x(t)+ax^2(t)]^2+a^2[x(t)+ax^2(t)]^3+o(z^4(t)),$$

$$k(t)=x(t)+ax^2(t)-a[x^2(t)+2ax^3(t)+a^2x^4(t)]+a^2[x^3(t)+3ax^4(t)]+o(z^4(t)),$$

$$k(t)=x(t)-a^2x^3(t)+o(x^4(t)).$$

Where the following is assumed:

$$k'(t) = \frac{z(t)}{1-az(t)} = z(t) - az^2(t) + a^2z^3(t) + o(z^4(t)).$$

From this, the following may be derived:

$$\frac{1}{2}[k'(t)+k(t)] = \frac{1}{2}\left[\frac{z(t)}{1+az(t)} + \frac{z(t)}{1-az(t)}\right]$$
$$= z(t) + a^2z^3(t) + o(z^4(t)).$$

Using, the correction for the term $ax^2$ introduced by block 210 is found by multiplying error laden signal 240 by the following correction factor:

$$\left[\frac{0.5}{1-az(t)} + \frac{1.5}{1+az(t)} - 1\right].$$

By multiplying error laden signal 240 by the aforementioned correction factor, output signal 250 becomes:

$$y(t) = z(t)\left[\frac{0.5}{1-az(t)} + \frac{1.5}{1+az(t)} - 1\right],$$

$$y(t) = x(t) - a^2x^3(t) + z(t) + a^2\begin{bmatrix}x^3(t)+\\3ax^4(t)\end{bmatrix} - z(t) + o(x^4(t)),$$

$$y(t) = x(t) + o(x^4(t)),$$

which is original input signal 230 with higher order terms, $o(x^4(t))$, but without the lower order term, $ax^2(t)$. As the higher order terms may be ignored in most applications, multiplication of error laden signal 240 by the aforementioned correction factor provides a corrected output signal 250 that reasonably approximates original input signal 230.

Figure 3:
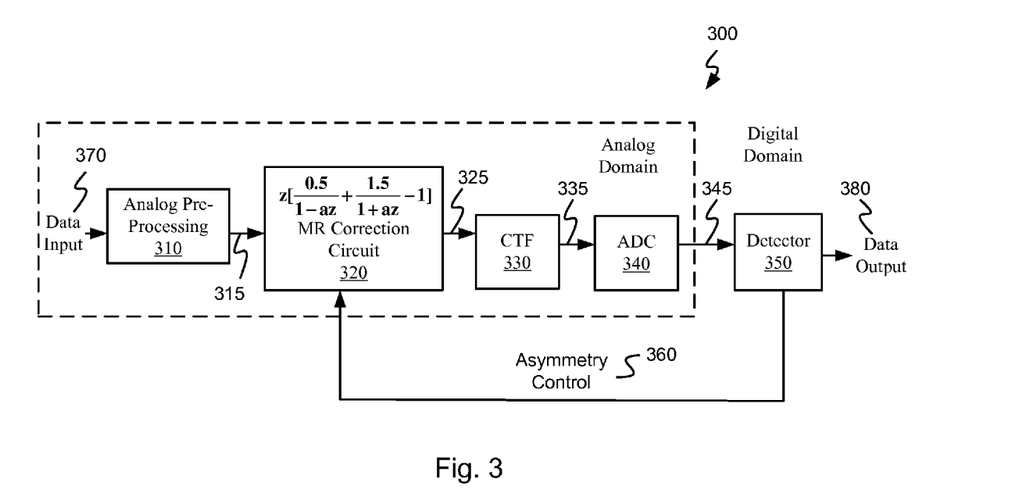
FIG. 3 shows a data processing loop circuit including an MR correction circuit in accordance with one or more embodiments of the present invention.

Turning to FIG. 3, a data processing loop circuit 300 including an MR correction circuit 320 in accordance with one or more embodiments of the present invention. Data processing loop circuit 300 includes various analog pre-processing circuitry 310. Such analog pre-processing circuitry 310 includes a variety of different circuits depending upon the needs of the particular design. For example, where the design is included in a hard disk drive application, analog pre-processing circuitry 310 may include a read/write head assembly capable of sensing magnetic information from a storage medium, a pre-amplifier capable of amplifying minute electrical signals, and/or one or more analog filters. In such cases, a data input 370 is a magnetic signal derived from a storage medium. Based upon the disclosure provided herein, one of ordinary skill in the art will recognize a variety of analog pre-processing circuitry that may be used in relation to different embodiments of the present invention.

An analog output signal 315 is provides as an input to MR correction circuit 320. MR correction circuit applies the following correction factor to analog output signal 315:

$$\left[\frac{0.5}{1-az(t)} + \frac{1.5}{1+az(t)} - 1\right].$$

The correction factor is designed to mitigate an error term introduced to data input 370 by analog pre-processing circuitry 310. After applying the correction factor, MR correction circuit 320 provides a corrected output 325. Corrected output 325 is provided to a continuous time filter 330. Continuous time filter 330 may be any analog filter known in the art that is capable of filtering unwanted portions of corrected output 325. All of analog pre-processing circuitry 310, MR correction circuit 320, continuous time filter 330 and an analog to digital converter 340 are implemented in an analog signal domain.

Continuous time filter 330 provides a filtered output 335 to analog to digital converter 340. Analog to digital converter 340 performs an analog to digital conversion of filtered output 335 and provides a corresponding digital signal 345. Digital signal 345 is provided in a digital signal domain to a data detector circuit 350. Data detector circuit 350 may be any data detector circuit known in the art including, but not limited to, a Viterbi algorithm detector and/or a maximum a posteriori detector as are known in the art. Data detector 350 performs a data detection algorithm on digital signal 345 and provides a data output 380. In addition, data detector 350 provides asymmetry control feedback 360 to MR correction circuit 320.

In operation, a data input signal is applied to data input 270. Various analog processes are applied to the data input signal resulting in analog output signal 315. MR correction circuit 320 applies a correction factor to analog output signal 315 to yield corrected output 325. The correction factor is designed to mitigate any error components added to the data input signal by analog pre-processing circuitry 310. Corrected output 325 is provided to a continuous time filter that filters corrected output 325 and provides filtered output 335. Analog to digital converter 340 provides a digital output 345 that represents filtered output 335 to a detector 350. Detector 350 performs a detection algorithm on digital output 345 resulting in data output 380. Depending upon the differences between data output 380 and digital output 345 (i.e., an error value), detector 350 provides asymmetry control feedback 360 to MR correction circuit 320. Such feedback in part governs the application of the correction factor to analog output signal 315.

Figure 4:
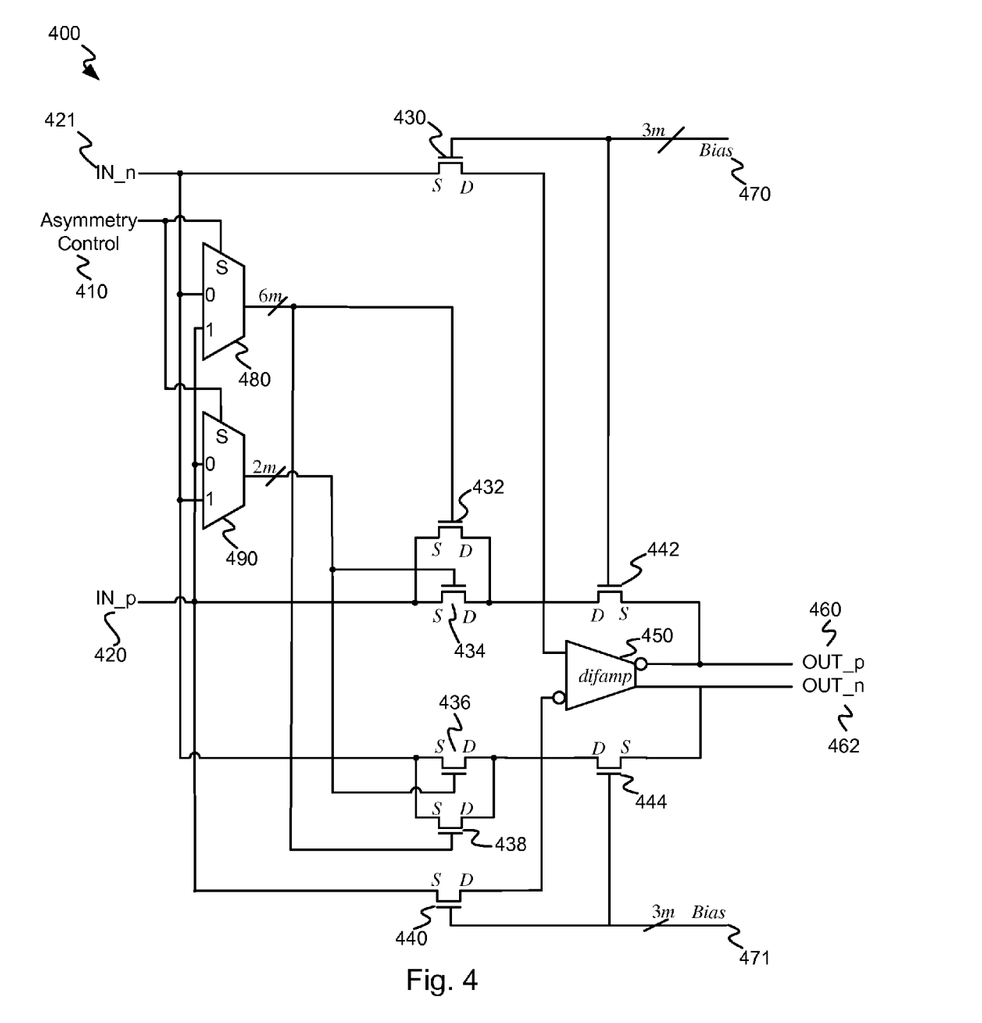
FIG. 4 depicts one implementation of an MR correction circuit in accordance with some embodiments of the present invention.

Turning to FIG. 4, one implementation of an MR correction circuit 400 in accordance with some embodiments of the present invention. MR correction circuit 400 may be used in place of MR correction circuit 320 of FIG. 3 as it implements the following correction factor:

$$\left[\frac{0.5}{1-az(t)} + \frac{1.5}{1+az(t)} - 1\right].$$

MR correction circuit 400 receives an asymmetry control signal 410 and a differential input that includes a positive input signal 420, a negative input signal 421, a bias voltage 470, and a bias voltage 471. MR correction circuit 400 provides a differential output including a positive output signal 460 and a negative output signal 461. Asymmetry control signal 410 is applied to the select input of a multiplexer 480 and to the select input of a multiplexer 490.

Positive input signal 420 is applied to the source of a transistor 434, to the source of a transistor 432, to the source of a transistor 440, to a '0' input of multiplexer 490 and to a '1' input of multiplexer 480. Negative input signal 421 is applied to the source of a transistor 430, to the source of a transistor 436, to the source of a transistor 438, to a '0' input of multiplexer 480 and to a '1' input of multiplexer 490. The output of multiplexer 480 is provided to the gate of transistor 432 and to the gate of transistor 438. The output of multiplexer 490 is provided to the gate of transistor 434 and to the gate of transistor 436. Bias voltage 470 is provided to the gate of transistor 430 and to the gate of transistor 442, and bias voltage 471 is provided to the gate of transistor 440 and to the gate of transistor 444.

The drain of transistor 430 is electrically coupled to a non-inverting input of a differential amplifier 450, and the drain of transistor 440 is electrically coupled to an inverting input of differential amplifier 450. Differential amplifier 450 provides positive output 460 and negative output 461. The drain of transistor 432 and the drain of transistor 434 are each electrically coupled to the drain of transistor 442, and the source of transistor 442 is electrically coupled to positive output 460. The drain of transistor 436 and the drain of transistor 438 are each electrically coupled to the drain of transistor 444, and the source of transistor 444 is electrically coupled to negative output 461.

Transistor 430, transistor 432, transistor 434, transistor 436, transistor 438, transistor 440, transistor 442 and transistor 444 are all sized relative to one another. This relative sizing results in the aforementioned correction factor. In particular, transistor 432 and transistor 438 each have an area that is twice as large as each of transistor 430, transistor 440, transistor 442 and transistor 444. Further, transistor 432 and transistor 438 each have an area that is three times as large as each of transistor 434 and transistor 436. The conductance of the transistors is set forth in the following equations:

$$\sigma_{transistors\ 442,444'} = \sigma_{transistors\ 430,440'} = \sigma_0,$$

$$\sigma_{transistors\ 432,438'} = \sigma_0(1-az(t)), \text{ and}$$

$$\sigma_{transistors\ 434,436'} = \sigma_0(1+az(t)).$$

In such cases, $\sigma_0$ is a selected conductance to which the transistors are sized. As such, the transfer function of MR correction circuit 400 is defined by the following equation:

$$\text{Output } 460 = \text{Input } 420\left[\frac{3m\sigma_0}{6m\sigma_0(1-az(t))} + \frac{3m\sigma_0}{2m\sigma_0(1+az(t))} - 1\right].$$

This may be reduced to:

$$\text{Output } 460 = \text{Input } 420\left[\frac{0.5}{(1-az(t))} + \frac{1.5}{(1+az(t))} - 1\right].$$

In some cases, the relative sizes are implemented by using transistors with different areas. In other cases, the relative sizes are implemented by using multiple transistors of a common size. Thus, in this case, transistor 432 and transistor 438 would each be implemented using six transistors in parallel; transistor 430, transistor 440, transistor 442 and transistor 444 would each be implemented using three transistors in parallel; and transistor 434 and transistor 436 would each be implemented using two transistors in parallel. In such a case, the drive signals provided to the gates of the transistors may be similarly multiplied. As an example, where transistor 432 and transistor 438 are each implemented using six transistors, multiplexer 480 may provide six drive signals (denoted '6m' on the drawing). Similarly, where transistor 434 and transistor 436 are each implemented using two transistors, multiplexer 480 may provide two drive signals (denoted '2m' on the drawing). Where transistor 430, transistor 440, transistor 442 and transistor 444 are each implemented using three transistors in parallel, bias voltage 470 and bias voltage 471 may be driven by three drive signals (denoted '3m' on the drawing).

It should be noted that the aforementioned relative sizes are approximate. For example, one transistor that is twice the size of another transistor is only approximately twice the size of the other transistor due to process limitations. A transistor that is twice the size is between 1.8 times and 2.2. times the size. As another example, one transistor that is three times the size of another transistor is only approximately three times the size of the other transistor due to process limitations. A transistor that is three times the size is between 2.7 and 3.3 times the size.

Bias voltage 470 and bias voltage 471 are a constant bias. In some embodiments of the present invention, bias voltage 470 is the common mode input voltage (common mode of positive input 420 and negative input 421). In some embodiments of the present invention, bias voltage 470 is the same common mode input voltage.

In operation, the polarity of the input signal is determined by the reversing characteristic of multiplexer 480 and multiplexer 490 that depends upon the assertion level of asymmetry control signal 410. Thus, for example, where asymmetry control signal 410 is asserted as a logic '1', the output from multiplexer 480 is positive input 420 and the output from multiplexer 490 is negative input 421. Where asymmetry control signal 410 is asserted as a logic '0' the reverse is true with the output from multiplexer 480 being negative input 421 and the output from multiplexer 490 being positive input 420.

Figure 5:
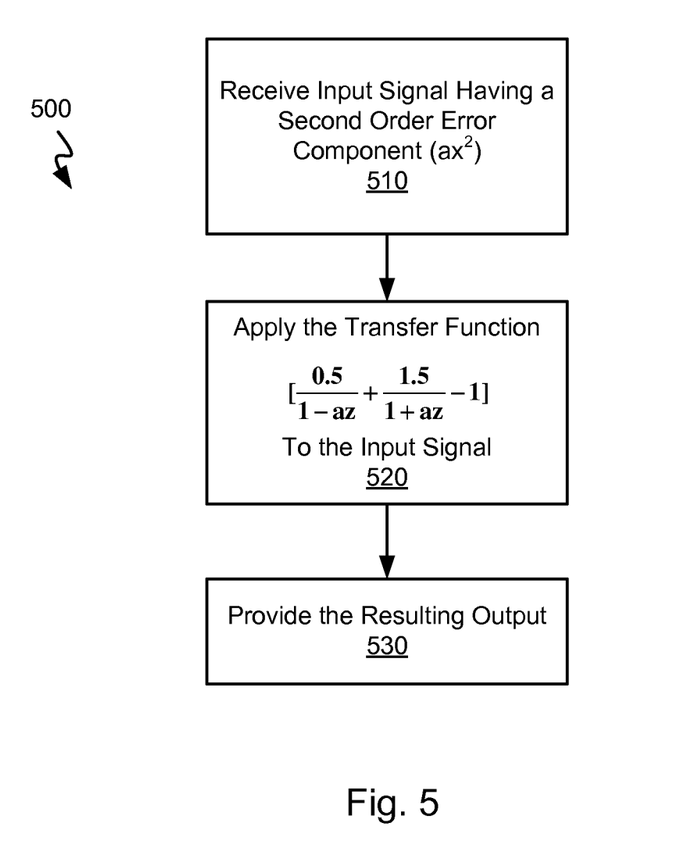
FIG. 5 is a flow diagram 500 depicting a method in accordance with some embodiments of the present invention for performing signal offset cancellation.

Turning to FIG. 5, a flow diagram 500 depicts a method in accordance with some embodiments of the present invention for performing signal offset cancellation. Following flow diagram 500, an input signal is received (block 510). This input signal may be received from a variety of sources. For example, the input signal may be received from an analog pre-processing circuit that is capable of sensing a magnetic field from a storage medium. The analog pre-processing circuit may introduce a second order error component ($ax^2$). A transfer function is applied to the input signal to reduce the second order error component (block 520). The transfer function is set forth below:

$$\left[\frac{0.5}{(1-az(t))} + \frac{1.5}{(1+az(t))} - 1\right].$$

In some cases, the transfer function is applied using a circuit similar to that discussed above in relation to FIG. 4. The result of applying the transfer function to the input signal is provided as an output (block 530). This output may be provided to a data processing circuit that includes a data detector circuit and/or a decoder circuit as are known in the art.

In conclusion, the invention provides novel systems, devices, methods and arrangements for signal offset cancellation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A signal offset cancellation system, the system comprising:
 a correction circuit, wherein the correction circuit is operable to:
  receive an input signal including an error component;
  apply a transfer function to the input signal to reduce the error component, wherein the transfer function is:

$$\left[\frac{0.5}{(1-az(t))} + \frac{1.5}{(1+az(t))} - 1\right],$$

wherein the z(t) term is the input signal and the a term is a scalar; and
  provide an output signal, wherein the output signal is the result of applying the transfer function to the input signal.

2. The system of claim 1, wherein the correction circuit includes an amplifier receiving the input signal and providing the output signal.

3. The system of claim 2, wherein the input signal is a differential input signal, and wherein the output signal is a differential output signal.

4. The system of claim 3, wherein the differential input signal includes a positive input signal and a negative input signal, wherein the differential output signal includes a negative output signal and a positive output signal, and wherein the amplifier includes:
 a differential amplifier including a first input, a second input, a first output and a second output, wherein the first output is electrically coupled to the positive output, and wherein the second output is electrically coupled to the negative output;
 a first transistor having a gate, a first leg, and a second leg, wherein the gate of the first transistor is electrically coupled to a bias voltage, wherein the first leg of the first transistor is electrically coupled to the negative input, and wherein the second leg of the first transistor is electrically coupled to the first input of the differential amplifier; and
 a second transistor having a gate, a first leg, and a second leg, wherein the gate of the second transistor is electrically coupled to the bias voltage, wherein the first leg of the second transistor is electrically coupled to the positive input, and wherein the second leg of the second transistor is electrically coupled to the second input of the differential amplifier.

5. The system of claim 4, wherein the bias voltage is the common mode of the positive input and the negative input.

6. The system of claim 4, wherein the amplifier further includes:
 a third transistor having a gate, a first leg, and a second leg, wherein the gate of the third transistor is electrically coupled to the negative input, and wherein the first leg of the third transistor is electrically coupled to the positive input;
 a fourth transistor having a gate, a first leg, and a second leg, wherein the gate of the fourth transistor is electrically coupled to the positive input, and wherein the first leg of the fourth transistor is electrically coupled to the negative input;
 a fifth transistor having a gate, a first leg, and a second leg, wherein the gate of the fifth transistor is electrically coupled to the bias voltage, wherein the first leg of the fifth transistor is electrically coupled to the second leg of the third transistor, and wherein the second leg of the fifth transistor is electrically coupled to the positive output; and
 a sixth transistor having a gate, a first leg, and a second leg, wherein the gate of the sixth transistor is electrically coupled to the bias voltage, wherein the first leg of the sixth transistor is electrically coupled to the second leg of the fourth transistor, and wherein the second leg of the sixth transistor is electrically coupled to the negative output.

7. The system of claim 6, wherein the first transistor, the second transistor, the fifth transistor and the sixth transistor each exhibit a first size; wherein the third transistor exhibits a second size; wherein the fourth transistor exhibits a third size; wherein the second size is approximately twice the first size; and wherein the second size is approximately three times the third size.

8. The system of claim 6, wherein the first transistor, the second transistor, the fifth transistor and the sixth transistor each exhibit a first size; wherein the third transistor exhibits a second size; wherein the fourth transistor exhibits a third size; wherein the third size is approximately twice the first size; and wherein the third size is approximately three times the second size.

9. The system of claim 4, wherein the amplifier further includes:
 a first selector circuit, wherein the first selector circuit provides the negative input when a selector control is asserted at a first assertion level and provides the positive input when the selector control is asserted at a second assertion level;
 a second selector circuit, wherein the second selector circuit provides the negative input when a selector control is asserted at the second assertion level and provides the positive input when the selector control is asserted at the first assertion level;
 a third transistor having a gate, a first leg, and a second leg, wherein the gate of the third transistor is electrically coupled to an output of the first selector circuit, and wherein the first leg of the third transistor is electrically coupled to the positive input;
 a fourth transistor having a gate, a first leg, and a second leg, wherein the gate of the fourth transistor is electrically coupled to an output of the second selector circuit, and wherein the first leg of the fourth transistor is electrically coupled to the positive input;
a seventh transistor having a gate, a first leg, and a second leg, wherein the gate of the seventh transistor is electrically coupled to the output of the second selector circuit, and wherein the first leg of the seventh transistor is electrically coupled to the negative input;
an eighth transistor having a gate, a first leg, and a second leg, wherein the gate of the eighth transistor is electrically coupled to the output of the first selector circuit, and wherein the first leg of the eighth transistor is electrically coupled to the negative input;
a fifth transistor having a gate, a first leg, and a second leg, wherein the gate of the fifth transistor is electrically coupled to the bias voltage, wherein the first leg of the fifth transistor is electrically coupled to the second leg of the third transistor and to the second leg of the fourth transistor, and wherein the second leg of the fifth transistor is electrically coupled to the positive output; and
a sixth transistor having a gate, a first leg, and a second leg, wherein the gate of the sixth transistor is electrically coupled to the bias voltage, wherein the first leg of the sixth transistor is electrically coupled to the second leg of the seventh transistor and to the second leg of the eighth transistor, and wherein the second leg of the sixth transistor is electrically coupled to the negative output.

10. The system of claim 9, wherein the first transistor, the second transistor, the fifth transistor and the sixth transistor each exhibit a first size;
wherein the third transistor and the eighth transistor exhibits a second size; wherein the fourth transistor and the seventh transistor exhibit a third size; wherein the second size is approximately twice the first size; and wherein the second size is approximately three times the third size.

11. The system of claim 9, wherein the system is incorporated in a read channel circuit of a hard disk drive, wherein the input signal is derived from a storage medium, wherein a derivative of the output signal is provided to detector circuit, and wherein the selector control is derived based upon an output of the detector circuit.

12. The system of claim 1, wherein the system is incorporated in a read channel circuit of a hard disk drive, wherein the input signal is derived from a storage medium, and wherein a derivative of the output signal is provided to data processing circuit.

13. A data processing circuit, the data processing circuit comprising:
an analog pre-processing circuit, wherein the analog pre-processing circuit receives a data input and provides a processed input, and wherein the processed input includes a second order error component;
a correction circuit, wherein the correction circuit is operable to:
receive the processed input;
apply a first order transfer function to the processed input to reduce at least a portion of the second order error component;
provide an output signal, wherein the output signal is the result of applying the transfer function to the input signal; and
a data detector circuit, wherein the detector circuit applies a detection algorithm to a derivative of the output signal.

14. The circuit of claim 13, wherein the correction circuit includes an amplifier receiving the input signal and providing the output signal, wherein the input signal is a differential input signal, wherein the output signal is a differential output signal, wherein the differential input signal includes a positive input signal and a negative input signal, wherein the differential output signal includes a negative output signal and a positive output signal, and wherein the amplifier includes:
a differential amplifier including a first input, a second input, a first output and a second output, wherein the first output is electrically coupled to the positive output, and wherein the second output is electrically coupled to the negative output;
a first transistor having a gate, a first leg, and a second leg, wherein the gate of the first transistor is electrically coupled to a bias voltage, wherein the first leg of the first transistor is electrically coupled to the negative input, and wherein the second leg of the first transistor is electrically coupled to the first input of the differential amplifier; and
a second transistor having a gate, a first leg, and a second leg, wherein the gate of the second transistor is electrically coupled to the bias voltage, wherein the first leg of the second transistor is electrically coupled to the positive input, and wherein the second leg of the second transistor is electrically coupled to the second input of the differential amplifier.

15. The circuit of claim 14, wherein the amplifier further includes:
a first selector circuit, wherein the first selector circuit provides the negative input when a selector control is asserted at a first assertion level and provides the positive input when the selector control is asserted at a second assertion level;
a second selector circuit, wherein the second selector circuit provides the negative input when a selector control is asserted at the second assertion level and provides the positive input when the selector control is asserted at the first assertion level;
a third transistor having a gate, a first leg, and a second leg, wherein the gate of the third transistor is electrically coupled to an output of the first selector circuit, and wherein the first leg of the third transistor is electrically coupled to the positive input;
a fourth transistor having a gate, a first leg, and a second leg, wherein the gate of the fourth transistor is electrically coupled to an output of the second selector circuit, and wherein the first leg of the fourth transistor is electrically coupled to the positive input;
a seventh transistor having a gate, a first leg, and a second leg, wherein the gate of the seventh transistor is electrically coupled to the output of the second selector circuit, and wherein the first leg of the seventh transistor is electrically coupled to the negative input;
an eighth transistor having a gate, a first leg, and a second leg, wherein the gate of the eighth transistor is electrically coupled to the output of the first selector circuit, and wherein the first leg of the eighth transistor is electrically coupled to the negative input;
a fifth transistor having a gate, a first leg, and a second leg, wherein the gate of the fifth transistor is electrically coupled to the bias voltage, wherein the first leg of the fifth transistor is electrically coupled to the second leg of the third transistor and to the second leg of the fourth transistor, and wherein the second leg of the fifth transistor is electrically coupled to the positive output; and
a sixth transistor having a gate, a first leg, and a second leg, wherein the gate of the sixth transistor is electrically coupled to the bias voltage, wherein the first leg of the sixth transistor is electrically coupled to the second leg of the seventh transistor and to the second leg of the eighth transistor, and wherein the second leg of the sixth transistor is electrically coupled to the negative output.

16. The circuit of claim 15, wherein the first transistor, the second transistor, the fifth transistor and the sixth transistor each exhibit a first size; wherein the third transistor and the eighth transistor exhibits a second size; wherein the fourth transistor and the seventh transistor exhibit a third size; wherein the second size is approximately twice the first size; and wherein the second size is approximately three times the third size.

17. The circuit of claim 14, wherein the amplifier further includes:
- a third transistor having a gate, a first leg, and a second leg, wherein the gate of the third transistor is electrically coupled to the negative input, and wherein the first leg of the third transistor is electrically coupled to the positive input;
- a fourth transistor having a gate, a first leg, and a second leg, wherein the gate of the fourth transistor is electrically coupled to the positive input, and wherein the first leg of the fourth transistor is electrically coupled to the negative input;
- a fifth transistor having a gate, a first leg, and a second leg, wherein the gate of the fifth transistor is electrically coupled to the bias voltage, wherein the first leg of the fifth transistor is electrically coupled to the second leg of the third transistor, and wherein the second leg of the fifth transistor is electrically coupled to the positive output; and
- a sixth transistor having a gate, a first leg, and a second leg, wherein the gate of the sixth transistor is electrically coupled to the bias voltage, wherein the first leg of the sixth transistor is electrically coupled to the second leg of the fourth transistor, and wherein the second leg of the sixth transistor is electrically coupled to the negative output.

18. The circuit of claim 17, wherein the first transistor, the second transistor, the fifth transistor and the sixth transistor each exhibit a first size; wherein the third transistor exhibits a second size; wherein the fourth transistor exhibits a third size; wherein the second size is approximately twice the first size; and wherein the second size is approximately three times the third size.

19. The circuit of claim 17, wherein the first transistor, the second transistor, the fifth transistor and the sixth transistor each exhibit a first size; wherein the third transistor exhibits a second size; wherein the fourth transistor exhibits a third size; wherein the third size is approximately twice the first size; and wherein the third size is approximately three times the second size.

20. A method for signal offset cancellation, the method comprising:
- receiving an input signal, wherein the input signal includes a second order error component;
- applying a transfer function to the input signal to reduce the second order error component, wherein the transfer function is:

$$\left[\frac{0.5}{(1-az(t))} + \frac{1.5}{(1+az(t))} - 1\right],$$

wherein the z(t) term is the input signal and the a term is a scalar; and
- providing an output signal, wherein the output signal is the result of applying the transfer function to the input signal.

* * * * *